United States Patent
Frenkel et al.

(10) Patent No.: US 12,414,239 B2
(45) Date of Patent: *Sep. 9, 2025

(54) METHODS FOR PRODUCING AN ETCH RESIST PATTERN ON A METALLIC SURFACE

(71) Applicant: Kateeva, Inc., Newark, CA (US)

(72) Inventors: Moshe Frenkel, Jerusalem (IL); Nava Shpaisman, Kedumim (IL)

(73) Assignee: Kateeva, Inc., Newark, CA (US)

( * ) Notice: Subject to any disclaimer, the term of this patent is extended or adjusted under 35 U.S.C. 154(b) by 287 days.

This patent is subject to a terminal disclaimer.

(21) Appl. No.: 18/164,798

(22) Filed: Feb. 6, 2023

(65) Prior Publication Data

US 2023/0189447 A1 Jun. 15, 2023

Related U.S. Application Data

(63) Continuation of application No. 16/912,818, filed on Jun. 26, 2020, now Pat. No. 11,606,863, which is a
(Continued)

(51) Int. Cl.
*H05K 3/06* (2006.01)
*C09D 11/54* (2014.01)
(Continued)

(52) U.S. Cl.
CPC .............. *H05K 3/062* (2013.01); *C09D 11/54* (2013.01); *C23F 1/02* (2013.01); *C23F 1/18* (2013.01); *H05K 3/061* (2013.01); *G03F 7/0002* (2013.01)

(58) Field of Classification Search
CPC .. H05K 3/062; H05K 3/061; H05K 2203/013; C09D 11/54; C23F 1/02; C23F 1/18; G03F 7/0002
(Continued)

(56) References Cited

U.S. PATENT DOCUMENTS

| 4,015,706 A | 4/1977 | Goffredo et al. |
| 4,127,438 A | 11/1978 | Babcock et al. |

(Continued)

FOREIGN PATENT DOCUMENTS

| CN | 1440466 A | 9/2003 |
| CN | 1659310 A | 8/2005 |

(Continued)

OTHER PUBLICATIONS

CN Second Office Action dated Jul. 10, 2024 for CN Patent Application No. 202110700960.9.
(Continued)

*Primary Examiner* — Duy Vu N Deo
(74) *Attorney, Agent, or Firm* — Hauptman Ham, LLP

(57) ABSTRACT

Methods and composition sets for forming etch-resist masks on a metallic surface are provided. The method may include depositing a first aqueous composition comprising a first reactive component onto a metallic layer of a substrate; depositing a second aqueous composition comprising a second reactive component on selected portions of the deposited first aqueous composition to form, from a chemical reaction between the first reactive component and the second reactive component, a bi-component material mask in a pattern to protect selected regions of the metallic layer; and depositing an etch solution to remove the metallic layer in regions not protected by the bi-component material mask.

19 Claims, 2 Drawing Sheets

Related U.S. Application Data continuation of application No. 15/578,300, filed as application No. PCT/IL2016/050567 on Jun. 2, 2016, now Pat. No. 10,743,420.

(60) Provisional application No. 62/170,713, filed on Jun. 4, 2015.

(51) Int. Cl.
*C23F 1/02* (2006.01)
*C23F 1/18* (2006.01)
*G03F 7/00* (2006.01)

(58) Field of Classification Search
USPC .......................................................... 216/41
See application file for complete search history.

(56) References Cited

U.S. PATENT DOCUMENTS

| | | |
|---|---|---|
| 4,604,314 A | 8/1986 | Gentzkow et al. |
| 4,756,994 A | 7/1988 | Araki et al. |
| 4,946,711 A | 8/1990 | Hawker et al. |
| 5,055,374 A | 10/1991 | Seio et al. |
| 5,376,503 A | 12/1994 | Audett et al. |
| 6,066,197 A | 5/2000 | Bristol et al. |
| 6,218,074 B1 | 4/2001 | Dueber et al. |
| 6,222,136 B1 | 4/2001 | Appelt et al. |
| 6,399,273 B1 | 6/2002 | Yamada et al. |
| 6,579,660 B1 | 6/2003 | Figov |
| 6,858,352 B1 | 2/2005 | Band |
| 6,860,925 B2 | 3/2005 | Soutar et al. |
| 7,147,765 B2 | 12/2006 | Klocke et al. |
| 7,282,240 B1 * | 10/2007 | Jackman ................. B82Y 40/00 427/282 |
| 8,421,215 B2 | 4/2013 | Tani et al. |
| 8,524,438 B2 * | 9/2013 | Kim ........................ B82Y 40/00 430/192 |
| 9,513,551 B2 * | 12/2016 | Frenkel ..................... G03F 1/50 |
| 10,398,034 B2 | 8/2019 | Shpaisman et al. |
| 10,743,420 B2 | 8/2020 | Frenkel et al. |
| 10,806,035 B2 | 10/2020 | Shpaisman et al. |
| 11,006,528 B2 | 5/2021 | Shpaisman et al. |
| 11,255,018 B2 | 2/2022 | Shpaisman et al. |
| 11,807,947 B2 | 11/2023 | Shpaisman et al. |
| 2003/0164466 A1 | 9/2003 | Hauf et al. |
| 2003/0177639 A1 | 9/2003 | Berg |
| 2004/0023120 A1 | 2/2004 | Nishikubo et al. |
| 2004/0079729 A1 | 4/2004 | Chen et al. |
| 2004/0245213 A1 | 12/2004 | Fukase et al. |
| 2005/0227492 A1 | 10/2005 | Hah et al. |
| 2005/0250052 A1 | 11/2005 | Nguyen |
| 2006/0020788 A1 | 1/2006 | Han et al. |
| 2006/0049129 A1 | 3/2006 | Hopper et al. |
| 2006/0060563 A1 | 3/2006 | Kim et al. |
| 2006/0199394 A1 | 9/2006 | Takahashi et al. |
| 2007/0237899 A1 | 10/2007 | Sawoska et al. |
| 2008/0245768 A1 | 10/2008 | Cottrell et al. |
| 2008/0308003 A1 | 12/2008 | Krol et al. |
| 2009/0116401 A1 | 5/2009 | Ginzburg et al. |
| 2009/0163615 A1 | 6/2009 | Halahmi et al. |
| 2009/0188706 A1 | 7/2009 | Endo |
| 2009/0278904 A1 | 11/2009 | Oh et al. |
| 2012/0045583 A1 | 2/2012 | Frenkel et al. |
| 2012/0288683 A1 | 11/2012 | Kuo et al. |
| 2013/0298398 A1 | 11/2013 | Miyasaka et al. |
| 2013/0334036 A1 | 12/2013 | Keigler et al. |
| 2014/0141169 A1 | 5/2014 | Huelsmann et al. |
| 2014/0252571 A1 | 9/2014 | Khandekar et al. |
| 2014/0290520 A1 | 10/2014 | Frenkel et al. |
| 2014/0363632 A1 | 12/2014 | Smet et al. |
| 2015/0159124 A1 | 6/2015 | Takahashi et al. |
| 2015/0267305 A1 | 9/2015 | Choi et al. |
| 2017/0264066 A1 | 9/2017 | Oki et al. |
| 2018/0146556 A1 | 5/2018 | Frenkel et al. |
| 2018/0192521 A1 | 7/2018 | Shpaisman et al. |
| 2018/0242457 A1 | 8/2018 | Shpaisman et al. |
| 2019/0335589 A1 | 10/2019 | Shpaisman et al. |
| 2020/0396842 A1 | 12/2020 | Frenkel et al. |
| 2021/0007225 A1 | 1/2021 | Shpaisman et al. |

FOREIGN PATENT DOCUMENTS

| | | |
|---|---|---|
| CN | 1899003 A | 1/2007 |
| CN | 1925724 A | 3/2007 |
| CN | 101023395 A | 8/2007 |
| CN | 104011265 A | 8/2014 |
| CN | 107710070 A | 2/2018 |
| EP | 1125760 B1 | 5/2006 |
| JP | S49-079240 | 7/1974 |
| JP | H07170053 A | 7/1995 |
| JP | 2002245794 A | 8/2002 |
| JP | 2003012971 A | 1/2003 |
| JP | 2005033049 A | 2/2005 |
| JP | 2005079479 A | 3/2005 |
| JP | 2006018095 A | 1/2006 |
| JP | 2007507616 A | 3/2007 |
| JP | 2007250884 A | 9/2007 |
| JP | 2009059777 A | 3/2009 |
| JP | 2009522205 A | 6/2009 |
| JP | 2009532205 | 9/2009 |
| JP | 2009272609 A | 11/2009 |
| JP | 2011171323 A | 9/2011 |
| JP | 2011243256 A | 12/2011 |
| JP | 2013162007 A | 8/2013 |
| JP | 2013211346 A | 10/2013 |
| JP | 2015129342 A | 7/2015 |
| JP | 2015227499 A | 12/2015 |
| JP | 2020501375 A | 1/2020 |
| KR | 1020090117253 A | 11/2009 |
| KR | 1020150109932 A | 10/2015 |
| TW | 201534756 A | 9/2015 |
| WO | 2003081966 A2 | 10/2003 |
| WO | 2009116401 A1 | 9/2009 |
| WO | 2016185215 A1 | 11/2016 |
| WO | 2016193978 A2 | 12/2016 |
| WO | 2017025949 A1 | 2/2017 |

OTHER PUBLICATIONS

JP Office Action dated Jul. 12, 2024 for JP Patent Application No. 2023-083553.
JP Office Action dated Sep. 9, 2024 for JP Patent Application No. 2023-111882.
Non-final Office Action dated Jun. 20, 2024 for U.S. Appl. No. 18/483,673.
Second Office Action issued Jul. 10, 2024 for CN Patent Application No. 202110700960.9.
CN Office Action issued on Jan. 25, 2021 for CN Patent Application No. 201780086295.
CN Office Action issued on Jul. 2, 2020 for CN Patent Application No. 201680038043.6.
CN Second Office Action dated May 12, 2021 for CN Patent Application No. 201680048035.X.
Decision of Refusal issued Jan. 26, 2021 in JP Patent Application No. 2018-515364.
Extended EP Search issued on Feb. 27, 2019 for EP Patent Application No. 16834759.9.
Extended EP Search Report issued Aug. 31, 2021 for EP Patent Application No. 21166748.0.
Extended EP Search Report issued Aug. 4, 2020 in EP Patent Application No. 17880261.7.
Extended EP Search Report issued on Jan. 3, 2019, to EP Patent Application 16802692.0.
Final Notice of Reasons for Refusal issued Jan. 26, 2021 in JP Patent Application No. 2019-092613.
Final Office Action issued Jul. 7, 2021 for U.S. Appl. No. 16/912,818.
Final Office action issued Feb. 11, 2019 for U.S. Appl. No. 15/751,866.
First Office Action issued Oct. 30, 2020 in CN Patent Application No. 201680048035X.

(56) References Cited

OTHER PUBLICATIONS

International Search Report and Written Opinion issued on Apr. 9, 2018 to PCT Application No. PCT/IL17/51338.
International Search report and Written Opinion issued on Jan. 6, 2017 to PCT Application No. PCT/IL/50820.
International Search Report and Written Opinion issued on Nov. 17, 2016 to PCT Application No. PCT/IL16/50567.
JP Decision of Refusal dated Mar. 10, 2023 for JP Patent Application No. 2019-531090.
JP Decision of Refusal dated Mar. 26, 2021 for JP Patent Application No. 2018-507595.
JP Decision of Refusal issued on Feb. 8, 2021 for JP Patent Application No. 2018-515364.
JP Final Notice of Reason of Refusal issued Feb. 8, 2021 for JP Patent Application No. 2019-092613.
JP Office Action issued Dec. 24, 2021 to JP Patent Application No. 2019-531090.
JP Office Action issued Jun. 5, 2020 to JP Patent Application No. 2018-515364.
KR Notification of Reason for Refusal issued Oct. 7, 2021 for KR Patent Application No. 10-2019-7016384.
KR Office Action dated Oct. 13, 2022 for KR Patent Application No. 10-2017-7037881.
Non Final Office Action issued on Jul. 20, 2020 to U.S. Appl. No. 16/507,358.
Non Final Office Action issued on Oct. 21, 2019 for U.S. Appl. No. 15/578,300.
Non Final Office Action issued on Oct. 9, 2019 to U.S. Appl. No. 15/751,866.
Non-final Office Action dated Mar. 21, 2023 for U.S. Appl. No. 17/647,756.
Non-Final Office Action dated May 18, 2021 for U.S. Appl. No. 16/912,818.
Non-Final Office Action dated Mar. 1, 2022 for U.S. Appl. No. 16/912,818.
Non-Final Office Action issued Aug. 11, 2021 in U.S. Appl. No. 16/948,597.
Non-final Office Action issued Aug. 12, 2022 for JP Patent Application No. 2019-531090.
Non-Final Office action issued on Sep. 28, 2018 to U.S. Appl. No. 15/751,866.
Non-Final Office Action issued Sep. 27, 2021 in U.S. Appl. No. 16/912,818.
Notice of Allowance dated Apr. 14, 2022 for U.S. Appl. No. 17/301,459.
Notice of Allowance issued Jan. 8, 2021 to U.S. Appl. No. 15/507,358.
Notice of Allowance issued Jun. 2, 2020 to U.S. Appl. No. 15/751,866.
Notice of Allowance issued Mar. 31, 2020 to U.S. Appl. No. 15/578,300.
Notice of Allowance issued Oct. 20, 2021 for U.S. Appl. No. 16/948,597.
Notice of Final Rejection dated Apr. 14, 2022 for KR Patent Application No. 10-2019-7016384.
Notice of First Office Action issued Jan. 25, 2021 in CN Patent Application No. 201780086295.0.
Notice of Reasons for Refusal issued Dec. 28, 2022 for JP Patent Application No. 2021-121139.
Notice of Reasons for Refusal issued Jul. 17, 2020 in JP Patent Application No. 20185075595.
Notice of Reasons for Refusal issued Jul. 20, 2022 for JP Patent Application No. 2021-121139.
Office Action issued Jun. 17, 2021 in TW Patent Application No. 106143295.
Quan et al. "Adsorption Behaviour of Schiff Base and Corrosion Protection of Resulting Films to Copper Substrate," Corrosion Science, vol. 44, pp. 703-715, Jun. 6, 2000.
Request for the Submission of an Opinion issued Aug. 10, 2022 in KR Patent Application No. 10-2018-7007265.
Second Office Action issued Sep. 1, 2021 for CN Patent Application No. 201780086295.0.
Third Office Action dated Apr. 1, 2022 for CN Patent Application No. 201780086295.
TW Examination and Search Report issued Dec. 21, 2022 for TW Patent Application No. 111105647.
Decision of Refusal dated Mar. 10, 2023 for JP Patent Application No. 2019-531090.
Notice of Allowance issued Jul. 12, 2023, in U.S. Appl. No. 17/647,756.
Notice of Allowance mailed Dec. 4, 2024, in U.S. Appl. No. 18/483,673.

* cited by examiner

METHODS FOR PRODUCING AN ETCH RESIST PATTERN ON A METALLIC SURFACE

CROSS-REFERENCE TO RELATED APPLICATIONS

This application is a continuation of U.S. patent application Ser. No. 16/912,818, filed Jun. 26, 2020, which is a continuation of U.S. patent application Ser. No. 15/578,300, filed Nov. 30, 2017, now U.S. Pat. No. 10,743,420, issued on Aug. 11, 2020, which is a national phase application of International Application No. PCT/IL2016/050567, filed Jun. 2, 2016, which claims the benefit of U.S. Provisional Application No. 62/170,713, filed Jun. 4, 2015, each of which is incorporated by reference herein in its entirety.

FIELD OF THE INVENTION

Embodiments of the invention relates to manufacturing conductive patterns on metallic surfaces, for example, printed circuit boards (PCBs) by applying etch-resist masks directly on a metallic layer.

BACKGROUND

Printed circuit boards (PCBs) are widely used in most electronic products. The manufacturing of PCBs is considered cheaper, faster and more accurate than using other wiring methods such as point-to-point construction. Still, there is an ongoing search for simpler and more cost-effective manufacturing processes that would maintain high quality and would enable to produce PCBs according to specific requirements including the manufacturing of cost-effective smaller batches, larger batches with high throughput, on-demand boards, boards with denser wiring, boards with thinner wires and others.

The wiring pattern in the manufacturing of a PCB is usually done by subtractive methods that involve removing copper from a copper layer laminated to an insulating material board, leaving only the desired copper wire (also refer to as pattern or image) as the electrically conducting paths. The process includes applying an etch-resist mask on the copper layer and removing exposed copper portions by an etching process. The current commonly used method for preparing the etch resist mask involves coating the copper layer with photosensitive etch-resist substance (generally, UV light sensitive substance); preparing a photo mask using, for example, photo plotter or laser plotter; exposing the layer to UV radiation to cure and fix the exposed areas as a pattern on top of the copper layer; and removing the unexposed etch-resist by chemical development. Only then, the wiring pattern can be produced by etching the unmasked copper portions following by a striping process for removing the etch-resist mask. The wiring pattern covers approximately 25% of the board's surface. During the production, however, the entire board is coated with the photosensitive etch-resist substance, followed by exposing the wiring pattern to UV or other radiation to form the etch-resist mask. The remaining photosensitive etch-resist substance is washed away.

The etch-resist pattern can also be applied by additive methods, for example by nonimpact printing (e.g. inkjet printing) on the copper layer. Conventional inkjet materials have relatively low viscosity and accordingly when ink drops would hit a non-absorbing surface, such as a copper surface, uncontrolled spreading of the drops and other phenomena such as clustering, coalescence and extensive dot gain usually occur. Accordingly, the printed pattern may exhibit reduced resolution, lack of details, inconsistent patterned line width, poor line edge smoothness, shorts between adjacent conductive lines and disconnection of pattern lines.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

Figure 1:
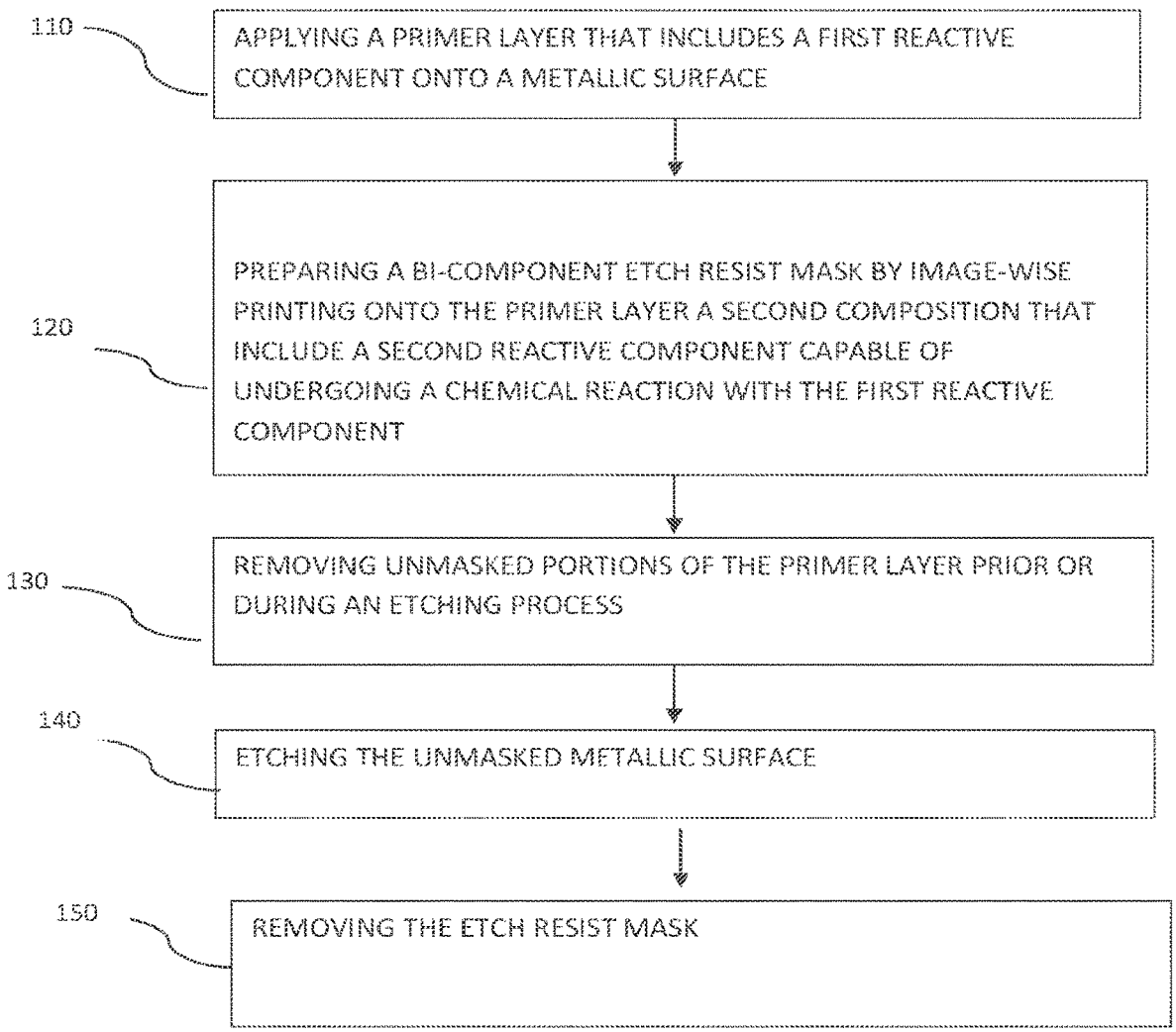
FIG. 1 is flowchart of a method for producing an etch-resist mask according to some embodiments of the invention.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

SUMMARY

Embodiments of the invention are related to methods of forming or applying etch-resist masks on a metallic layer by nonimpact printing. The method may include applying a first liquid composition comprising a first reactive component onto a metallic surface to form a primer layer; and imagewise printing by a nonimpact printing process on the primer layer a second liquid composition comprising a second reactive component to produce an etch-resist mask according to a predetermined pattern, wherein when droplets of the second liquid composition contact the primer layer, the second reactive component undergoes a chemical reaction with the first reactive component so as to immobilize the droplets.

Embodiments of the invention are related to a two-part ink composition set for applying an etch-resist mask on a metallic layer. The set may include a first liquid composition comprising a fixating reactive component and a second liquid composition comprising an etch-resist reactive component, wherein the fixating reactive component and the fixating reactive component are capable undergoing a chemical reaction to form a bi-component material that is insoluble in water and in an acidic etch solution.

DETAILED DESCRIPTION

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

Embodiments of the invention are related to methods of forming or applying etch-resist masks on a metallic layer by nonimpact printing, for example by inkjet printing. Embodiments of the method may be applicable, for example, for the manufacturing of printed circuit boards (PCBs). A method of applying an etch-resist mask on a metallic surface according to embodiments of the invention may include applying a first liquid composition comprising a first reactive component onto the surface to form a primer layer followed by printing a second liquid composition comprising a second reactive component on the primer layer to produce an etch resist mask according to a predetermined pattern. According to embodiments of the invention, the second reactive component undergoes a chemical reaction with the first reactive component to produce a bi-component material that is insoluble in water and in an etch solution. The bi-component material has an increased viscosity relative to the separate components and the reaction causes immobilization of the droplets of the second composition when hitting the primer layer.

The metallic layer may be a copper layer laminated onto an insulating non-conductive substrate. For ease of explanation, the description below refers to a copper surface. It should be realized that other metallic surfaces, such as, aluminum surfaces, stainless steel surfaces, gold surfaces and others are likewise applicable to embodiments of the invention.

According to embodiments of the invention, the etch-resist mask may be formed by consecutively applying onto the metallic layer two liquid compositions, each comprising a reactive component that can undergo a chemical reaction with another reactive component contained in the other composition. The product of the chemical reaction is referred to as a bi-component material. Each one of the compositions is water-soluble and the bi-component reaction product material is both water-insoluble and etch-solution-insoluble. Namely, the bi-component reaction product material is neither water-soluble nor soluble in the etching solution, which is used to etch the metallic layer. According to some embodiments, the etch solution may be an acidic etch solution, such as for example, copper chloride & hydrogen peroxide mixture.

According to some embodiments, at least one of the compositions may comprise more than one reactive component that can undergo a chemical reaction with one or more reactive components in the other composition. According to embodiments of the invention, one of the compositions may include multivalent and/or poly-cationic groups and/or multivalent inorganic cations and may function as a fixating composition. The other composition may include poly-anionic groups and may function as an etch resist composition. In some embodiments, removal of the layer containing the fixating composition prior the etching process may not be required and this layer is removed during the etching process.

For example, a non-limiting list of fixating reactive components may include polyethyleneimine, divalent salts, heteropolymer of vinyl pyrolidon and others.

According to embodiments of the invention, the first composition may be applied onto the copper surface by inkjet printing or any other printing or coating method either as a uniform layer or in an image-wise form. The second composition is printed using a nonimpact printing method, for example by inkjet printing to form the desired wiring pattern. When a droplet of the second composition hits the primer layer on top of the metallic surface, the chemical reaction that undergoes between the two reactive components (i.e. the multivalent and/or polycationic or multivalent cation reacting with the polyanion) cause an instantaneous relatively large increase in the viscosity of the second composition, which prevents the uncontrolled spreading of the droplet. The droplet is immobilized or freezes without being spread on the surface. According to embodiments of the invention, the reactive component of the first composition may be a fixating component that when reacting with the second component of the second composition chemically fixates the printed pattern to the substrate. The reactive component of the second composition may be an etch-resistant component. Such a component may include for example, an acid etched resistant substance that prohibits acid etching. In some embodiments, the fixating component may be capable of adhering to the metallic layer to ensure that the etch-resist mask would remain attached to the metallic layer during the etching process. According to other embodiments, the reactive component of the first composition may be the etch-resistant component and the reactive component of the second composition may be the fixating component.

The composition comprising the fixating component may be applied onto the metallic surface as a primer layer to form a uniform or patterned layer using nonimpact printing or any other known coating methods. The composition comprising the etch-resistant component may then be image-wise applied by nonimpact printing to form the etch-resist mask. In some embodiments, an acid solution may be added to the first composition to activate the fixating material.

Alternatively, according to some embodiments of the invention, the composition comprising the etch resistant component may be applied onto the metallic surface as a primer layer to form a uniform or patterned layer using nonimpact printing or any other known method. The composition comprising the fixating component may then be image-wise applied by nonimpact printing to form the etch-resist mask. For ease of explanation, the description below mainly refer to embodiments in which the fixating composition is applied directly on top of the metallic surface and the etch resist composition is deposited on the formed fixating layer. It should be understood however, that the description below refers also to embodiments in which the sequence of depositing the composition is reversed.

Some embodiments of the invention may be related to a two-part ink composition set for applying etch-resist mask on a metallic surface. The set may include two solutions, each stored in a different container (e.g., two aqueous solutions), the first solution may include a fixating component and the second solution may include an etch-resist component. The fixating component in the first solution and the etch resist component in the second solution may react with each other to form an etch-resist insoluble composition that is neither water-soluble nor soluble in the etching solution and has good adherence to metals, such as copper.

Figure 2:
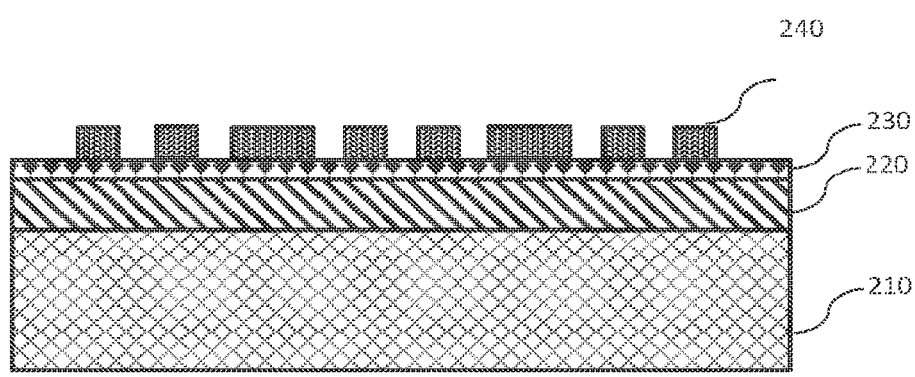
FIG. 2 is an illustration helpful in understanding the method for producing an etch-resist mask according to embodiments of the invention.

Reference is made to FIG. 1, which is a flowchart of a method of producing conductive patterns according to some embodiments of the invention and to FIG. 2, which illustrates the process of FIG. 1. According to embodiments of the invention, as illustrated in box 110, in some embodiments the method may include forming a primer layer onto a metallic surface. The primer layer (e.g., layer 230 of FIG. 2) may be formed by applying a first liquid composition comprising a first reactive component onto a metallic surface (e.g., surface 220 of FIG. 2) laminated to an electrically insulating substrate (e.g. substrate 210 of FIG. 2). The reactive component of the first composition may be water-soluble fixating component and may include reactive cationic groups, for example, polycations or multivalent cations. The cationic reactive component may be capable of adhering to metallic surfaces, such as copper surfaces. In some embodiments, applying the first liquid composition may be done by any industrial coating method.

Non-limiting examples of the cationic reactive component may include polyamides, for example, polyethyleneimine, poly-quaternary amines, long-chain quaternary amines, poly-tertiary amines at various pH levels and multivalent inorganic cations such as magnesium cation, zinc cation, calcium cation, copper cation, ferric and ferrous cation. The polymeric components may be introduced to the formulation either as soluble components or in emulsion form. The primer layer may be applied to the metallic surface using any suitable printing or coating method including by not limited to, inkjet printing, spraying, metering rod coating, roll coating, dip coating and others. The primer layer may be uniform or patterned.

In some embodiments, the primer layer may be a continuous layer that substantially covers the entire metallic surface. Alternatively, the primer layer may be image-wise printed according to the required pattern. The pattern may be applied by nonimpact printing, for example, by ink-jet printing. The required pattern may be, for example, copper wiring of a PCB.

As illustrated in box 120, in some embodiments, the method may include printing by a nonimpact printing process a second liquid composition that comprises a second reactive component on the primer layer. The printing is being performed image-wise, using for example an inkjet printer to form an etch resist mask according to a predetermined pattern onto the metallic surface. During the printing process of the second liquid the metal surface may be heated up to an elevated temperature to further improve printing quality. Typical surface temperatures mat range from 25° C. and up to 80° C. The second liquid composition comprises a second reactive component that can undergo a chemical reaction with the first reactive component contained in the primer layer to immobilize droplets of the second composition when contacting or hitting the primer layer. The product of the chemical reaction is a material that has substantially higher viscosity than each of the first and second compositions and is insoluble in both water and the etching solution. The insoluble etch-resist pattern may have a dry layer thickness of at least 0.01 microns. In some embodiments, the thickness of the printed pattern may be at most 12 microns.

In some embodiments, the reactive component of the second composition may be water-soluble and may include reactive anionic groups. Non-limiting examples of anionic reactive component may include at least one anionic polymer (in a base form) at pH higher than 7.0. The anionic polymer may be selected from acrylic resins and styrene-acrylic resins in their dissolved salt forms. The anionic polymer may be selected from sulphonic resins in their dissolved salt form, such as sodium, ammonium or amine neutralized form as well as in the form of polymer emulsion or dispersion. Polymeric components may be introduced to the formulation either as soluble components or in emulsion form. Alternatively, in some embodiments, the method may include applying the etch-resist composition to form the primer layer the second layer may be formed by printing the fixating composition in an image-wise pattern using a nonimpact printing method.

As illustrated in box 130, in some embodiments, the method may include removing exposed or non-masked portions of the primer layer, which may be either a fixation layer containing the cationic component or alternatively in other embodiments the etch resist layer containing the polyanionic reactive component. If the first layer is the fixating layer, in some embodiments, the fixation composition may be washed away during the etching process. The exposed portions of the first layer may include mainly the reactive component and may easily be washed away simply by immersing the board in water while the etch resist mask formed by the chemical reaction of the first and second reactive materials is insoluble and remains attached to the metallic surface.

As illustrated in box 140, embodiments of the method may include etching metallic surface. For example, a masked copper board may be etched by a copper etching (e.g., acidic copper etching) solution to remove non-masked copper portions. As illustrated in box 150, the etch resist mask is then removed. For example, in PCB manufacturing, a predetermined wiring pattern of conductive copper lines attached to the surface of the insulating board 210 may be revealed upon removal of the etch resist mask.

EXAMPLES

Using an Epson stylus 4900 inkjet printer exemplary etch resist compositions (second composition as described in here) were printed on an FR4 copper clad boards having a thickness of ½ Oz, ⅓ Oz and 1 Oz. In some cases, the copper was first coated using an Epson stylus 4900 inkjet printer with a fixating composition (first composition as described in here) forming a fixating layer on which the etch resist compositions were selectively printed according to a predetermined pattern. In the description below, % (w/w) is a measure of the concentration of a substance in terms of the percentage by weight relative to the weight of the composition. Copper from the unprotected by the etch resist-exposed zones was etched away using an etchant bath containing a ferric chloride etchant solution of strength 42°. Baume supplied by Amza [pernix 166]. The etching was performed in a Spray Developer S31, supplied by Walter Lemmen GMBH, at a temperature of 35° C. for 3 minutes. The etch resist mask was stripped off by immersing the etched board in a 1% (w/w) NaOH in aqueous solution at a temperature of 25° C. followed by washing the FR4 copper board with water and drying by air at 25° C. The copper boards were also etched, in some experiments, using an industrial etching unit including hyper and super etching units, manufacture by Universal or Shmidth containing Copper chloride solution for etching non-protected copper.

Example 1

An etch resist composition printed on top of an uncoated copper FR4 board (comparative data). An etch resist composition (second composition) was prepared with 10% propylene glycol and 1% (w/w) 2-Amino-2-methyl propanol, 0.3% (w/w) of BYK 348 supplied by BYK and 2% (w/w) of Bayscript BA Cyan. These materials were dissolved in water containing 24% Joncryl 8085 styrene acrylic resin solution as the anionic reactive component. Using an Epson stylus 4900 inkjet printer the etch resist composition was printed on an FR4 copper clad board having a thickness of ½ Oz to produce the etch resist mask. The dry etch resist thickness was 5 microns.

The etch-resist mask was visually inspected and the printed pattern demonstrated a very poor print quality with extremely poor edge definition, line breaks and severe shorts between the lines.

Example 2

The etch resist composition was prepared as detailed in Example 1. A primer or fixating composition was prepared as a mixture of an aqueous solution of 10% (w/w) LUPASOL PR8515 supplied by BASF (Polyethylenimine as the cationic reactive component), 10% (w/w) Propylene glycol, 10% n-Propanol and 0.3% (w/w) containing TEGO 500 supplied by Evonik Industries (a foam-inhibiting substrate wetting additive).

An FR4 Copper board was coated using Epson stylus 4900 inkjet printer. The coated plate was left to dry at room temperature resulting in a fully transparent uniform coating having a thickness of 0.3μ dry layer covering the entire surface without any crystal formation. Using an Epson stylus 4900 inkjet printer, the etch resist composition was printed on the coated copper board and dried at 80° C. to produce a bi-component etch resist mask. The etch-resist mask was visually inspected to show a better print quality than Example 1 but still a relatively poor print quality with broadens lines and shorts between lines. The etching of the unmasked copper and removal of the etch resist mask were conducted as detailed in example 1. The wiring pattern produced after the etching process had an identical image as the etch resist mask with the same broaden lines and shorts between lines. It should be noted that for certain applications the print quality as exhibited by Example 2 may be sufficient.

Example 3

The etch resist composition was prepared as detailed in Example 1. The fixating composition was prepared as detailed in Example 2 with the exception of replacing 0.3% (w/w) TEGO 500 with 0.3% (w/w) TEGO 500 containing 13% (w/w) concentrate HCl.

An FR4 Copper board was coated with the fixation composition using Epson stylus 4900 inkjet printer as detailed in Example 2 and after drying a coating layer as detailed in Example 2 was formed. Similarly to Example 2, the etch resist composition was inkjet-printed on the coated copper board and dried at 80° C. to produce a bi-component etch resist mask. The etch resist pattern demonstrated a high print quality with well-defined thin lines having a thickness of down to 2 millimeters, sharp edges and no line breaks. The etching of the unmasked copper and removal of the etch resist mask were conducted as detailed in example 1. The wiring pattern produced by the etching and stripping processes demonstrated a well-defined pattern with thin lines having a width of down to 15 micron sharp edges and no line breaks.

Example 4

Bi-component reaction, an etch resist composition printed on a copper surface coated with a reactive cationic composition containing Hydrochloric acid (HCl). The etch resist composition was prepared as detailed in Example 1. A fixating composition was prepared as a mixture of an aqueous solution of 10% (w/w) Styleze W-20 (supplied by ISP as a 20% polymer in aqueous solution), 0.1% of BYK 348, and 13% (w/w) concentrate HCl.

An F4F copper board was covered using a Mayer rod with the fixating composition to produce a dry layer having a thickness of 0.4μ. The coated board was left to dry, resulting in a fully transparent coating over the entire copper surface with no crystal formation. Similarly to Example 2, the etch resist composition was inkjet-printed on the coated copper board and dried at 80° C. to produce a bi-component etch resist mask.

The etch resist pattern demonstrated a high print quality well-defined and thin lines down to 2 millimeters contained sharp edges and no line breaks. Residue of the fixating layer that was not covered by the etch resist composition was washed by socking the board in water for 2 minutes at temperature of 25° C. and dried at 80° C. Etching of the exposed copper and removal of the etch resist mask were conducted as detailed in Example 1. The wiring pattern on the board demonstrated well-defined thin lines with a width down to 2 mil containing sharp edges and no line breaks.

Example 5

Bi-component reaction, an etch resist composition printed on a copper surface coated with a reactive cationic composition containing Hydrochloric acid (HCl). The etch resist composition was prepared as detailed in Example 1. A fixating composition was prepared as a mixture of an aqueous solution of 10% (w/w) Lupasol HF (supplied by BASF as a 56% polymer in aqueous solution), 0.1% of BYK 348 containing 13% (w/w) concentrate HCl.

An FR4 copper board was covered using a Mayer rod with the fixating composition to produce a dry layer having a thickness of 1μ. The coated board was left to dry, resulting in a fully transparent coating over the entire copper surface with no crystal formation. Similarly to Example 2, the etch resist composition was inkjet-printed on the coated copper board and dried at 80° C. to produce a bi-component etch resist mask.

The etch resist pattern demonstrated a high print quality well-defined and thin lines down to 2 mil contained sharp edges and no line breaks. Residue of the fixating layer that not covered by the etch resist composition was washed by socking the board in water for 3 minutes at temperature of 25° C. and dried at 80° C. Etching of the exposed copper and removal of the etch resist mask were conducted as detailed in Example 1. The wiring pattern on the board demonstrated well-defined thin lines with a width down to 2 mil containing sharp edges and no line breaks.

Example 6

Bi-component reaction: an etch resist composition printed on a copper surface coated with a reactive cationic composition containing Hydrochloric acid (HCl). The etch resist composition was prepared as detailed in Example 1. A fixating composition was prepared as a mixture of an aqueous solution of 10% (w/w) Lupasol PN 50 (supplied by BASF as a 49% polymer in aqueous solution), 0.1% of BYK 348 containing 13% (w/w) concentrated HCl.

An FR4 copper board was covered using a Mayer rod with the fixating composition to produce a dry layer having a thickness of 1μ. The coated board was left to dry, resulting in a fully transparent coating over the entire copper surface with no crystal formation. Similarly to Example 2, the etch resist composition was inkjet-printed on the coated copper board and dried at 80° C. to produce a bi-component etch resist mask.

The etch resist pattern demonstrated a high print quality well-defined and thin lines down to 2 millimeters containing sharp edges and no line breaks. Residue of the fixating layer as detailed in Example 5. Etching of the exposed copper and removal of the etch resist mask were conducted as detailed in Example 1. The wiring pattern on the board demonstrated well-defined thin lines with a width down to 2 mil containing sharp edges and no line breaks.

Example 7

Bi-component reaction, an etch resist composition printed on a copper surface coated with a reactive composition containing citric acid. The etch resist composition was prepared as detailed in Example 1. A fixating composition was prepared as a mixture of an aqueous solution of 10% (w/w) citric acid, 25% (w/w) Propylene glycol, containing 0.3% (w/w) TEGO 500 supplied by Evonik Industries (a foam-inhibiting substrate wetting additive).

An FR4 Copper board was coated with the fixating composition using an Epson stylus 4900 inkjet printer. The coated plate was left to dry at room temperature resulting in a fully transparent uniform coating having a thickness of 0.3μ dry layer covering the entire surface without crystal formation. Similarly to Example 2, the etch resist composition was inkjet-printed on the coated copper board and dried at 80° C. to produce a bi-component etch resist mask.

The etch resist pattern demonstrated a high print quality well-defined and thin lines down to 2 mil containing sharp edges and no line breaks. Etching of the exposed copper and removal of the etch resist mask were conducted as detailed in Example 1. The wiring pattern on the board demonstrated well-defined thin lines with a width down to 2 mil containing sharp edges and no line breaks.

Example 8

Bi-component reaction, coating composition containing the etch resist composition was prepared as detailed in Example 1. A fixating composition was prepared as a mixture of an aqueous solution of 2.5% (w/w) Zn(NO3)2, 3.75% (w/w) Calcium acetate, 0.2% (w/w) Capstone 51, 5% (w/w) n-Propanol and 5% (w/w) Lupasol FG (supplied by BASF).

An FR4 copper board was covered using a Mayer rod with the fixating composition to produce a dry layer having a thickness of 0.5μ. The coated board was left to dry, resulting in a fully transparent coating over the entire copper surface with no crystal formation. Similarly to Example 2, the etch resist composition was inkjet-printed on the coated copper board and dried at 80° C. to produce a bi-component etch resist mask.

Similarly to Example 2, the etch resist composition was inkjet-printed on the coated copper board and dried at 80° C. to produce a bi-component etch resist mask.

The etch resist pattern demonstrated a high print quality well-defined and thin lines down to 2 mil containing sharp edges and no line breaks. Etching of the exposed copper and removal of the etch resist mask were conducted as detailed in Example 1. The wiring pattern on the board demonstrated well-defined thin lines with a width down to 2 mil containing sharp edges and no line breaks.

Example 9

A etch-resist composition was prepared as a mixture of an aqueous solution of 8% (w/w) PVA, 24% Joncryl 8085 styrene acrylic resin solution (supplied as a 42% polymer in aqueous solution) and 1.5% of 2-Amino 2-methyl propanol.

A fixating composition was prepared as follows: 2% (w/w) of Basacid Red 495, 10% (w/w) Propylene glycol, 10% n-Propanol, 0.3% (w/w) TEGO500, 10% (w/w) Lupasol G20 (supplied by BASF) containing 12% (w/w) HCl concentrated. An FR4 copper board was covered using a Mayer rod with the etch-resist composition to produce a dry layer having a thickness of 2.4μ. The coated board was left to dry, resulting in a fully transparent coating over the entire copper surface with no crystal formation. The fixating composition was inkjet-printed on the coated copper board and dried at 80° C. to produce a bi-component etch resist mask.

Similarly to Example 2, the etch resist composition was inkjet-printed on the coated copper board and dried at 80° C. to produce a bi-component etch resist mask.

The etch resist pattern demonstrated a high print quality well-defined and thin lines down to 2 mil containing sharp edges and no line breaks. Residue of the coating which was not covered by the etch resist ink was washed by socking the board in aqueous solution of 1% (w/w) NaHCO3 for 30 seconds at temperature of 25° C. and dried at 80° C. Etching of the exposed copper and removal of the etch resist mask were conducted as detailed in Example 1. The wiring pattern on the board demonstrated well-defined thin lines with a width down to 2 mil containing sharp edges and no line breaks.

Cationic Compositions (Fixating Reactive Component)

Non-limiting examples of cationic reactive component (a fixating reactive component) may include polyamides, for example, Polyethyleneimine, divalent metal salts, acids both organic or inorganic, Heteropolymer of vinyl pyrolidon, dimethylaminopropyl methacrylamide; methacryloylaminopropy lauryl dimethyl ammonium chloride, Poly-quaternary amines and polyamines in natural form or as ammonium salts.

The thickness of a dried fixating layer may be as thin as around 0.01 microns. A typical desired thickness for a dry layer may vary between 0.025 and 5 microns.

The cationic composition (first composition) may include additional components adapted to suit the method of application and the desired width of the dried layer. The composition may have a viscosity suitable for spraying or ink-jet printing, for example, a viscosity of less than 60 centipoise or between 3-20 cP (centipoise) at an ambient temperature, respectively. The composition might have higher viscosity in case a different coating method is applied.

In some embodiments, an acidic solution may be added to the first solution in order to increase reactivity of first layer to the copper layer 320 as well as its reactivity to the etch resist or fixating layer. In some embodiments, the first layer may further be developed, for example, by water, prior to the copper etch process. In some embodiments, the applied first layer may be dried prior to the application of the second layer. The as dried layer may contain mainly the first reactive material. The first layer may be dried using any know drying method.

Some non-limiting examples of first reactive components (e.g., a fixating component) and first compositions (e.g., fixating composition, cationic composition) are listed in Table 1.

TABLE 1

| | Fixating Composition | Reactive component chemical group |
|---|---|---|
| 1 | Aqueous solution of 10% (w/w) Polyethyleneimine, 10% (w/w) Propylene glycol, 10% n-Propanol, 0.3% (w/w) containing surfactants | Polyethyleneimine Molecular weight (Mw) 500-5000 |
| 2 | Aqueous solution of 10% (w/w) Polyethyleneimine, 10% (w/w) | Polyethyleneimine Mw 6000-2000000 |

TABLE 1-continued

| Fixating Composition | Reactive component chemical group |
|---|---|
| Propylene glycol, 10% n-Propanol, 0.3% (w/w) containing surfactants | |
| 3 Aqueous solutions of 10% (w/w) Heteropolymer of VP, 10% (w/w) Propylene glycol, 10% n-Propanol, 0.3% (w/w) containing surfactants | Heteropolymer of vinylpyrolydon, dimethylaminopropyl methacrylamide & methacryloylaminopropy lauryl dimethyl ammonium chloride |
| 4 Aqueous solution of 10% (w/w) Poly-quaternary amine, 10% (w/w) Propylene glycol, 10% n-Propanol, 0.3% (w/w) containing surfactants | Poly-quaternary amines |
| 5 Aqueous solution of 3% (w/w) Polyethyleneimine, 5% metal salts, 10% (w/w) Propylene glycol, 10% n-Propanol, 0.3% (w/w) containing surfactants | Polyethyleneimine (Mw 500-5000) contains divalent metal salts (e.g., Ca, Zn, Mg, etc.) |
| 6 Aqueous solution of 3% (w/w) Polyethyleneimine, 5% metal salts, 10% (w/w) Propylene glycol, 10% n-Propanol, 0.3% (w/w) containing surfactants. | Polyethyleneimine (Mw 600-2000000)__contains divalent metal salts (Ca, Zn, Mg, etc.) |

Anionic Compositions (Etch Resist Polymeric Component)

In some embodiments, the second reactive component (e.g., a polymeric component) may be an etch-resistant component (resistant to the metallic etching solution). The second reactive component may include polyanion active groups such as: acrylates, styrene acrylates; phosphates and sulfonates. A droplet of the etch-resist ink applied on top of the first (e.g., fixating) layer can be immobilized and fixated to the copper surface due to a chemical reaction between the first reactive material (that includes poly-cations) and the second reactive material (that includes poly-anions). Since the fixation is very rapid (in the micro-second range) the dimension of the printed pattern is similar to the dimension of the required pattern. The compound formed by the reaction of first reactive material and the second reactive material (both of which are soluble in water) should be insoluble in copper etch solution.

The second composition may have a viscosity suitable for inkjet printing of less than 60 cP, for example, 3-20 cP at the jetting temperature. The composition might have higher viscosity in case a different coating method is applied. In some embodiments, the second composition may include no more than 20% (w/w) of the reactive component to sustain the required viscosity. In some embodiments, the polyanion reactive component (the etch-resist polymer) when dissolved in composition may have a maximal of 5000 molar weight (e.g., the polymer may have relatively short chains). In some embodiments, the etch-resist polymer may have higher molar weight resulting in a composition in a form of polymeric emulsion or dispersion. The second reactive component may have high acidic value, for example, having more than 100 reactive anionic groups per gram of polymer. For example, an etch-resist polymer according to embodiments of the invention may have more than 200, 240, 300 or more reactive anionic groups in each chain.

Some non-limiting examples of the second reactive components (etch resistant components) and second compositions (etching resistant compositions, anionic compositions) are listed in Table 2.

TABLE 2

| etching resistant composition | Second reactive component |
|---|---|
| 1 2% (w/w) of Cyan dye, 10% propylene glycol, 1% (w/w) 2-Amino-2-methyl propanol and 0.3% (w/w) of surfactant were dissolved in water containing 24% styrene acrylic resin solution. | acrylates Mw 800-17,000 Acid No 130-240 in Solution or emulsion |
| 2 2% (w/w) of Cyan dye, 10% propylene glycol, 1% (w/w) 2-Amino-2-methyl propanol and 0.3% (w/w) of surfactant were dissolved in water containing 24% phosphates resin solution. | Organo-phosphates Mw 800-17,000 Acid No 130-240 In Solution or emulsion |
| 3 2% (w/w) of Cyan dye, 10% propylene glycol, 1% (w/w) 2-Amino-2-methyl propanol and 0.3% (w/w) of surfactant were dissolved in water containing 24% sulfonates resin solution. | Organo-Sulfonates Mw 800-17,000 Acid No 130-240 In Solution or emulsion |

In some embodiments, a fixating composition listed in Table 1 and an etching resistant composition listed in Table 2 may be included in a kit for forming etch-resist mask according to some embodiments of the invention.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

What is claimed is:

1. A method comprising:
    depositing a first aqueous composition comprising a first reactive component comprising a reactive polymer, a long-chain quaternary amine, or a metal cation onto a substrate;
    depositing a second aqueous composition comprising a second reactive component comprising an anionic material onto the substrate, wherein, upon contact between the first aqueous composition and the second aqueous composition, the first reactive component chemically reacts with the second reactive component to form an immobilized bi-component mask, wherein one or more of depositing the first aqueous composition and depositing the second aqueous composition is a patterned deposition comprising non-impact printing, and one or more of the first aqueous composition and the second aqueous composition is deposited directly onto a metallic layer of the substrate;
    removing unreacted portions of the first aqueous composition, the second aqueous composition, or both to expose portions of the metallic layer; and
    depositing an etch solution to remove the exposed portions of the metallic layer.

2. The method of claim 1, wherein the first reactive component is a fixating reactive component and the second reactive component is an etch-resist reactive component.

3. The method of claim 1, wherein the first reactive component is an etch-resist reactive component and the second reactive component is a fixating reactive component.

4. The method of claim 1, wherein:
    the first reactive component comprises at least one imine group, at least one amine group, or both; and
    the anionic material comprises at least one phosphate group, at least one sulfonate group, at least one acrylate group, or any combination thereof.

5. The method of claim 1, wherein at least one of the first reactive component and the second reactive component comprises a polymer.

6. The method of claim 1, wherein the bi-component mask is insoluble in at least one of water and the etch solution.

7. The method of claim 1, wherein the first and second aqueous compositions are deposited on the substrate sequentially in a first deposition and a second deposition, and further comprising drying the material deposited in the first deposition before performing the second deposition.

8. The method of claim 1, wherein the removing the unreacted portions and depositing of the etch solution are performed concurrently.

9. The method of claim 1, further comprising removing the bi-component mask after depositing the etch solution.

10. The method of claim 1, wherein the patterned deposition comprises inkjet printing.

11. The method of claim 1, wherein the metallic layer comprises copper.

12. The method of claim 1, wherein at least one of the first aqueous composition and the second aqueous composition further comprises a dye.

13. The method of claim 1, wherein both the first and the second aqueous compositions are deposited by inkjet printing.

14. The method of claim 1, wherein:
the first reactive component comprises a first reactive polymer and the second reactive component comprises a second reactive polymer.

15. The method of claim 14, wherein the first reactive polymer comprises one or more of a polyethyleneimine, a heteropolymer of vinyl pyrrolidone, a poly-quaternary amine, and a polyamine in a natural form or as an ammonium salt.

16. The method of claim 14, wherein the second reactive polymer comprises one or both of acrylate and styrene acrylate.

17. The method of claim 1, wherein depositing the first aqueous composition comprises depositing the first aqueous composition as a continuous coating on the metallic layer.

18. The method of claim 1, wherein, in a dried state, a thickness of the bi-component mask ranges from 0.01 μm to 12 μm.

19. A method comprising:
depositing a first aqueous composition comprising a first reactive component directly onto a metallic layer of a substrate;
depositing a second aqueous composition comprising a second reactive component onto the substrate in contact with the first aqueous composition, wherein upon contact the first and the second reactive components undergo a chemical reaction to form an immobilized bi-component mask, wherein depositing the first aqueous composition comprises non-impact printing, depositing the second aqueous composition comprises non-impact printing, or both;
removing unreacted material from the substrate to expose portions of the metallic layer; and
applying an etch solution to the substrate to remove the exposed portions of the metallic layer,
wherein each of the first and second reactive components comprises a material chosen from the group consisting of reactive polymers, long-chain quaternary amines, a metal cation, and an anionic component.

* * * * *